US 8,258,576 B2

(12) United States Patent
Ohta (10) Patent No.: US 8,258,576 B2
(45) Date of Patent: Sep. 4, 2012

(54) METHOD OF MANUFACTURING A SEMICONDUCTOR DEVICE INCLUDING EPITAXIALLY GROWING SEMICONDUCTOR EPITAXIAL LAYERS ON A SURFACE OF SEMICONDUCTOR SUBSTRATE

(75) Inventor: Hiroyuki Ohta, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/541,279

(22) Filed: Aug. 14, 2009

(65) Prior Publication Data

US 2009/0302395 A1    Dec. 10, 2009

Related U.S. Application Data

(62) Division of application No. 11/797,253, filed on May 2, 2007, now Pat. No. 7,592,214.

(30) Foreign Application Priority Data

Oct. 26, 2006    (JP) .................................. 2006-290773

(51) Int. Cl.
*H01L 27/12*    (2006.01)
(52) U.S. Cl. ................ 257/351; 257/369; 257/E21.632; 257/E29.31
(58) Field of Classification Search .................. 438/142, 438/197, 199, 216, 220; 257/351, E21.632, 257/E29.31, 369
See application file for complete search history.

(56) References Cited

U.S. PATENT DOCUMENTS

| 5,583,059 | A | 12/1996 | Burghartz |
| 6,121,100 | A | 9/2000 | Andideh et al. |
| 7,101,742 | B2 | 9/2006 | Ko et al. |
| 7,303,949 | B2 | 12/2007 | Chen et al. |
| 7,378,305 | B2 | 5/2008 | Hatada et al. |
| 7,402,496 | B2 * | 7/2008 | Liu et al. ........................ 438/300 |
| 7,442,967 | B2 | 10/2008 | Ko et al. |
| 7,518,188 | B2 | 4/2009 | Shima et al. |
| 7,718,500 | B2 * | 5/2010 | Chong et al. ................... 438/300 |

(Continued)

FOREIGN PATENT DOCUMENTS

CN    1581508 A    2/2005
(Continued)

OTHER PUBLICATIONS

Chinese Office Action dated Mar. 27, 2009, issued in corresponding Chinese Patent Application No. 200710104207.3, Mar. 27, 2009.

(Continued)

*Primary Examiner* — Khiem D Nguyen
(74) *Attorney, Agent, or Firm* — Westerman, Hattori, Daniels & Adrian, LLP (57)    ABSTRACT

A semiconductor device has a first MOS transistor formed on first active region of the first conductivity type, having first gate electrode structure, first source/drain regions, recesses formed in the first source/drain regions, and semiconductor buried regions buried and grown on the recesses for applying stress to the channel under the first gate electrode structure, and a second MOS transistor formed on second active region of the second conductivity type, having second gate electrode structure, second source/drain regions, and semiconductor epitaxial layers formed on the second source/drain regions without forming recesses and preferably applying stress to the channel under the second gate electrode structure. In a CMOS device, performance can be improved by utilizing stress and manufacture processes can be simplified.

7 Claims, 10 Drawing Sheets

U.S. PATENT DOCUMENTS

| | | |
|---|---|---|
| 2005/0053470 A1 | 3/2005 | Yamazaki et al. |
| 2006/0189056 A1 | 8/2006 | Ko et al. |
| 2006/0202278 A1 | 9/2006 | Shima et al. |
| 2007/0238236 A1* | 10/2007 | Cook et al. ............... 438/197 |
| 2008/0061366 A1 | 3/2008 | Liu et al. |

FOREIGN PATENT DOCUMENTS

| | | |
|---|---|---|
| JP | 7-193235 A | 7/1995 |
| JP | 9-45900 A | 2/1997 |
| JP | 2006-196549 A | 7/2006 |
| JP | 2006-216955 A | 8/2006 |
| JP | 2006-253317 A | 9/2006 |
| JP | 2006-253318 A | 9/2006 |
| JP | 2006-261283 A | 9/2006 |
| JP | 2009-524260 A | 6/2009 |
| WO | 2005-043591 A2 | 5/2005 |
| WO | 2006-083821 A1 | 8/2006 |
| WO | 2007-112228 A1 | 10/2007 |

OTHER PUBLICATIONS

K. Ang et al. "Enhanced Performance in 50 nm N-MOSFETs with Silicon-Carbon Souce/Drain Regions", IEDM Tech. Dig., 2004, p. 1069-1071, 2004.

T. Ghani et al., "90nm High Volume Manufacturing Logic Technology Featuring Novel 45nm Gate Length Strained Silicon CMOS Transistors", IEDM Tech. Dig., 2003, p. 978-980, 2003.

Y. Kim, "A Highly Robust SiGe Source Drain Technology realized by Disposable Sidewall Spacer (DSW) for 65nm Node and Beyond", Proceedings of ESSDERC, 2005, pp. 305-308, 2005.

H. Wakabayashi et al., "Improved Sub-10-nm CMOS Devices with Elevated Source/Drain Extensions by Tunneling Si-Selective-Epitaxial-Growth", IEDM 2005, pp. 151-154, 2005.

Chinese Office Action dated Mar. 27, 2009, issued in corresponding Chinese Patent Application No. 200710104207.3, (Mar. 27, 2009).

K. Ang et al. "Enhanced Performance in 50 nm N-MOSFETs with Silicon-Carbon Souce/Drain Regions", IEDM Tech. Dig., 2004, p. 1069-1071, (2004).

T. Ghani et al., "90nm High volume Manufacturing Logic Technology Featuring Novel 45nm Gate Length Strained Silicon CMOS Transistors", IEDM Tech. Dig., 2003, p. 978-980, (2003).

Y. Kim, "A Highly Robust SiGe Source Drain Technology realized by Disposable Sidewall Spacer (DSW) for 65nm Node and Beyond", Proceedings of ESSDERC, 2005, pp. 305-308, (2005).

H. Wakabayashi et al., "Improved Sub-10-nm CMOS Devices with Elevated Source/Drain Extensions by Tunneling Si-Selective-Epitaxial-Growth", IEDM 2005, pp. 151-154, (2005).

Japanese Office Action dated Jan. 31, 2012, issued in corresponding Japanese Patent Application No. 2006-290773 with an English language translation, (Jan. 31, 2012).

Japanese Office Action dated Apr. 17, 2012 (mailing date), issued in corresponding Japanese Patent Application No. 2006-290773 and an English language translation, (Apr. 17, 2012).

* cited by examiner

METHOD OF MANUFACTURING A SEMICONDUCTOR DEVICE INCLUDING EPITAXIALLY GROWING SEMICONDUCTOR EPITAXIAL LAYERS ON A SURFACE OF SEMICONDUCTOR SUBSTRATE

CROSS REFERENCE TO RELATED APPLICATION

This application is a divisional application of the U.S. application Ser. No. 11/797,253, filed on May 2, 2007, now issued as U.S. Pat. No. 7,592,214, which is based on and claims priority of Japanese Patent Application No. 2006-290773 filed on Oct. 26, 2006, the entire contents of which are incorporated herein by reference.

BACKGROUND OF THE INVENTION

A) Field of the Invention

The present invention relates to a semiconductor device and its manufacture method, and more particularly to a semiconductor device having MOS transistors with stress applying mechanisms and its manufacture method. A field effect transistor having a gate electrode made of a lamination of a gate insulating film and a conductor film formed on a semiconductor active region is called a MOS transistor.

B) Description of the Related Art

Micro patterning has advanced in order to improve the integration density and operation speed of a silicon semiconductor integrated circuit. Micro patterning shortens the gate length of a MOS transistor. At a gate length of 65 nm or shorter, there is a limit on performance improvement by micro patterning.

As technologies of improving the performance of a MOS transistor apart from micro patterning, attention has been paid to a stress transistor which improves the mobility of carriers by strain (stress application). Strain is generated by applying a stress to the channel region of a MOS transistor to increase the mobility of electrons or holes and improve an on-current.

The mobility of electrons of an n-channel (N) MOS transistor is improved by tensile stress along the gate length direction. The mobility of holes of a p-channel (P) MOS transistor is improved by compressive stress along the gate length direction.

If the source/drain regions of an NMOS transistor is made of an epitaxial crystal layer of silicon-carbon (Si—C) mixed crystal (C-doped Si) having a smaller lattice constant than that of a Si substrate, a tensile stress is applied to Si crystal in the channel so that the mobility of electrons is increased (refer to K. Ang et al.: IEDM Tech. Dig., 2004, p. 1069).

If the source/drain regions of a PMOS transistor is made of an epitaxial crystal layer of silicon-germanium (Si—Ge) mixed crystal having a larger lattice constant than that of a Si substrate, a compressive stress is applied to Si crystal in the channel so that the mobility of holes is increased (refer to T. Ghani et al.: IEDM Tech. Dig., 2003, p. 978 and Y. S. Kim et al.: Proceedings of ESSDERC 2005. p. 305)

As the gate length is shortened further, it becomes more difficult to realize a shallow junction depth of the source/drain regions to suppress the short channel effect. It has been proposed to selectively grow Si epitaxial layers on Si substrate, and form extension regions and source/drain regions in or through the epitaxial layers (refer to Wakabayashi et al.: IEDM 2005, pp. 151-154).

By applying stress to the channel of a MOS transistor, it becomes possible to increase the mobility of carriers and improve the performance of the MOS transistor. The mobility of electrons of an NMOS transistor is increased by tensile stress, and the mobility of holes of a PMOS transistor is increased by compressive stress.

SUMMARY OF THE INVENTION

If the source/drain regions of a PMOS transistor are etched and dug and Si—Ge crystal is grown and if the source/drain regions of an NMOS transistor are etched and dug and Si—C crystal is grown, desired stresses can be applied to both PMOS and NMOS. However, manufacture processes become complicated. More simple manufacture processes are desired.

An object of the present invention is to provide technologies capable of improving the performance of a semiconductor device including NMOS transistors and PMOS transistors by utilizing stresses and simplifying the manufacture processes.

According to one aspect of the present invention, there is provided a semiconductor device comprising:

a semiconductor substrate including a first active region of a first conductivity type and a second active region of a second conductivity type;

a first MOS transistor including a first gate electrode structure formed on the first active region, first source/drain regions of the second conductivity type formed in the first active region on both sides of the first gate electrode structure, recesses dug from surfaces of the first source/drain regions, and semiconductor buried regions of the second conductivity type grown being buried in the recesses and applying stress to a channel under the first gate electrode structure; and a second MOS transistor including a second gate electrode structure formed on the second active region, second source/drain regions of the first conductivity type formed in the second active region on both sides of the second gate electrode structure, and semiconductor epitaxial layers of the first conductivity type formed on the second source/drain regions without involvement of recesses.

According to another aspect of the present invention, there is provided a semiconductor device manufacture method comprising the steps of:

(a) forming a first active region of a first conductivity type and a second active region of a second conductivity type in a semiconductor substrate;

(b) forming first and second gate electrode structures on the first and second active regions, respectively;

(c) forming semiconductor epitaxial layers of the first conductivity type on the first and second active regions on both side of, and spaced by a predetermined distance from, the first and second gate electrode structures, without involving recesses;

(d) executing ion implantation for forming source/drain regions at least in the second active region via the epitaxial layers;

(e) masking the second active region, removing the semiconductor epitaxial layers on both sides of, and spaced by a predetermined distance from, the first gate electrode structure, and digging the first active region from a surface thereof to form recesses; and (f) epitaxially growing semiconductor buried regions of the second conductivity type, the semiconductor buried regions burying the recesses and applying stress to a channel under the first gate electrode structure.

The source/drain regions of one of NMOS and PMOS transistors are etched and dug and stress applying substance is buried, and epitaxial growth is performed for the other transistor without etching, to thus simplify the manufacture processes.

Since ion implantation is performed after the epitaxial growth, ion implantation conditions can be mitigated.

DESCRIPTION OF THE PREFERRED EMBODIMENTS

Embodiments of the present invention will now be described with reference to the accompanying drawings.

Figure 1A:
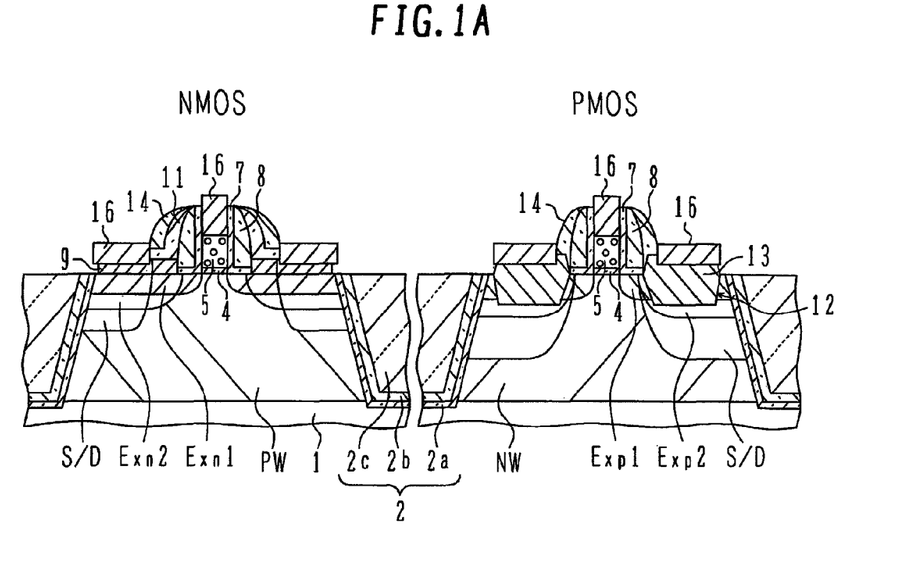
FIGS. 1A and 1B are cross sectional views of semiconductor substrates schematically showing the structures of semiconductor devices according to first and second embodiments.
Figure 1B:
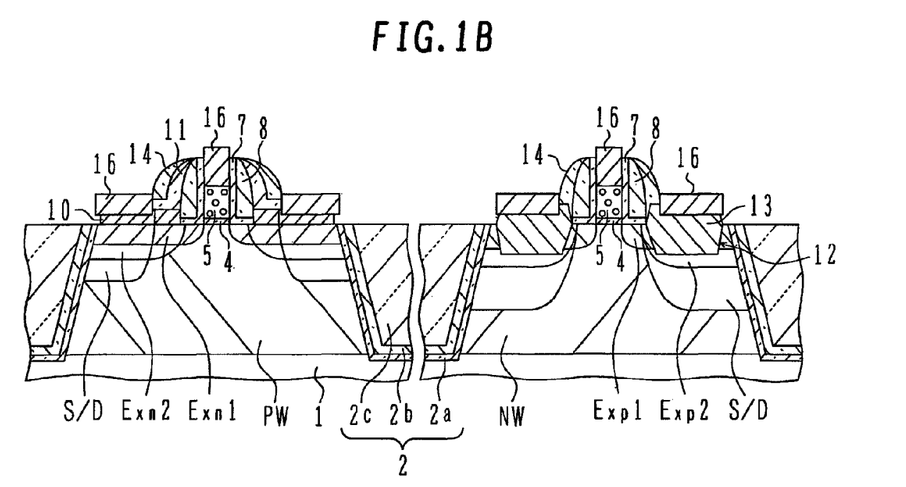

FIGS. 1A and 1B are cross sectional views schematically showing the structures of semiconductor devices according to the first and second embodiments.

Referring to FIG. 1A, a p-type well PW and an n-type well NW are formed in the surface layer of a Si substrate 1 in active regions defined by an isolation region 2. For example, the isolation region 2 is formed by shallow trench isolation (STI) and made of a silicon oxide film liner 2a, a silicon nitride film liner 2b and a silicon oxide film 2c deposited by a high density plasma chemical vapor deposition (HDP-CVD) and made dense. An NMOS transistor is formed in the p-type well PW and a PMOS transistor is formed in the n-type well NW.

A gate electrode is formed traversing each of the active regions and made of a lamination of a gate insulating film 4, a polysilicon layer 5 and a silicide layer 16. First sidewall spacers are formed on the sidewalls of each of the gate electrodes, the first sidewall spacer being made of a lamination of a silicon oxide film 7 and a silicon nitride film 8. First extension regions Exn1 and Exp1 are formed in the active regions on both sides of the gate electrodes, and second extension regions Exn2 and Exp2 are formed in the active regions on both sides of the first sidewall spacers.

In the NMOS transistor, Si—C epitaxial layers 9 are grown on the surfaces of the active region outside the first sidewall spacers. The Si—C epitaxial layers 9 have a smaller lattice constant than that of Si. The Si—C epitaxial layers apply tensile stress to the channel below the gate electrode along the gate length direction and improve the electron mobility. Second sidewall spacers made of a silicon oxide film 11 and a silicon nitride film 14 are formed on the epitaxial layers 9 of the NMOS transistor and on the sidewalls of the first sidewall spacers, and source/drain regions S/D are formed in the active region outside the second sidewall spacers. A Ni—Si silicide layer 16 is formed on the Si—C epitaxial layer 9 outside the second sidewall spacers.

In the PMOS transistor, source/drain regions S/D are formed in the active region outside the first sidewall spacers, and the surface layers of the source/drain regions are etched and dug to form recesses 12. Si—Ge mixed crystal epitaxial layers 13 having a larger lattice constant than that of Si are grown on the recesses 12. The Si—Ge epitaxial layers 13 apply compressive stress to the channel below the gate electrode along the gate length direction and improves the hole mobility. Second sidewall spacers made of a silicon nitride film 14 are formed on the epitaxial layers 13 and on the sidewalls of the first sidewall spacers. A Ni—Si silicide layer 16 is formed on the Si—Ge epitaxial layers 13 outside the second sidewall spacers.

In the structure shown in FIG. 1A, the surface layers of the source/drain regions of only the PMOS transistor are etched to form recesses, and Si—Ge crystal is buried in the recesses. In the NMOS transistor, the Si—C epitaxial layer is grown on the Si substrate without forming recesses. Processes can be made simpler than those in the case where the source/drain regions of both PMOS and NMOS transistors are dug and Si—Ge and Si—C crystals are grown. In the NMOS transistor, the Si—C crystal is grown on the silicon substrate so that the surfaces of the source/drain regions swell to a level higher than the substrate surface. An ion implantation depth in the Si substrate is made shallower by an amount corresponding to the thickness of the epitaxial layer, so that the ion implantation conditions can be mitigated.

In the structure shown in FIG. 1B, instead of the Si—C layers 9 shown in FIG. 1A, Si layers 10 are epitaxially grown on the source/drain regions of the NMOS transistor formed on the Si substrate. Other structures are the same as those shown in FIG. 1A. Mitigation of the ion implantation conditions can be realized by the swell of the surfaces of the source/drain regions by the epitaxial layers 10, similar to the structure shown in FIG. 1A. Since the epitaxial layers 10 on the Si substrate are silicon, substantial stress is not applied to the substrate from the epitaxial layers 10.

FIGS. 2A to 2L are schematic cross sectional views of a semiconductor substrate illustrating main processes of the manufacture method for the semiconductor devices shown in FIGS. 1A and 1B.

Figure 2A:
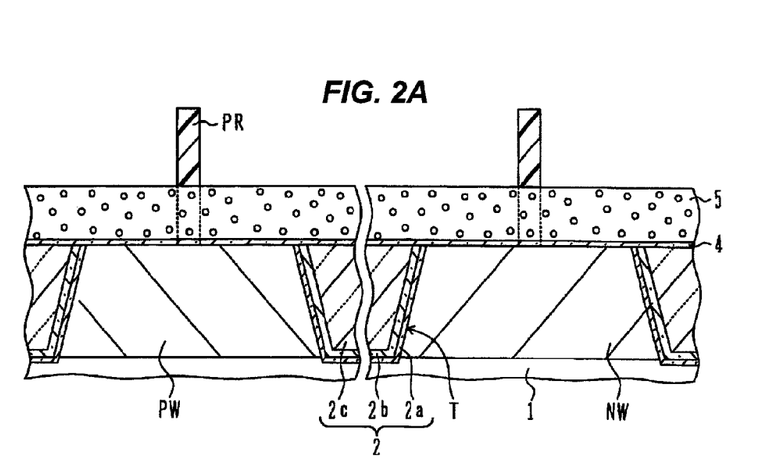
FIGS. 2A to 2L are cross sectional views of a semiconductor substrate illustrating main processes of a manufacture method for the structures shown in FIGS. 1A and 1B.

As shown in FIG. 2A, an isolation region 2 for defining active regions is formed in a silicon substrate 1. The isolation region 2 is formed, for example, by shallow trench isolation (STI). A silicon nitride film pattern having an opening above the isolation region is formed on the surface of the silicon substrate 1, with a silicon oxide film being interposed therebetween. The silicon substrate 1 in the opening is etched to form a trench T. The silicon surface exposed in the trench T is thermally oxidized to form a silicon oxide film 2a as a first liner. A silicon nitride film 2b as a second liner is formed covering the silicon oxide film 2a, for example, by chemical vapor deposition (CVD). After two types of liners are formed, a silicon oxide film 2c is buried in the trench by high density plasma (HDP) CVD. Unnecessary portions of the silicon oxide film deposited on the substrate surface is polished and removed by chemical mechanical polishing (CMP). During CMP, the silicon nitride pattern functions as a polishing stopper. After CMP, the silicon nitride film is removed, for example, with hot phosphoric acid. The silicon oxide film is removed by dilute hydrofluoric acid or the like. In this way, the isolation region 2 by STI shown in FIG. 2A can be formed.

After the isolation region 2 is formed, a p-type well PW is formed in an NMOS transistor region through ion implantation of p-type impurities, and an n-type well NW is formed in a PMOS transistor region through ion implantation of n-type impurities, by using resist masks for separating the regions.

The silicon oxide film on the surface of the active region is removed with dilute hydrofluoric acid or the like, and the surface is again thermally oxidized to form a gate insulating film 4 having a thickness of, e.g., 1.2 nm. Nitrogen may be introduced into this silicon oxide film. Another insulating film having a high dielectric constant may be stacked on the silicon oxide film. A polysilicon layer 5 having a thickness of, e.g., 100 nm is formed on the gate insulating film 4 to form a gate electrode layer.

A photoresist pattern PR having a gate electrode shape is formed on the gate electrode layer 5, and the polysilicon layer 5 and gate insulating film 4 under the photoresist pattern are patterned by anisotropic etching. The photoresist pattern is removed thereafter by ashing or the like.

Figure 2B:
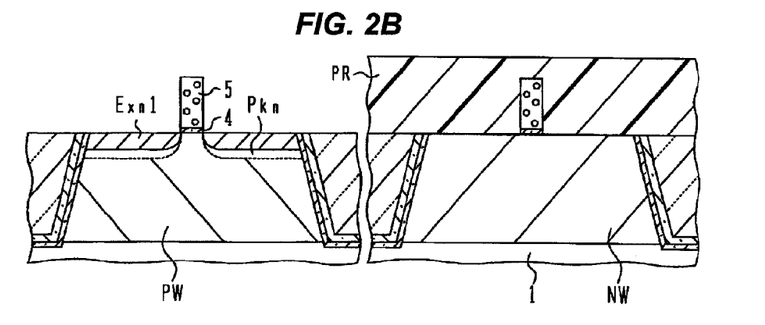

As shown in FIG. 2B, a photoresist pattern PR is formed covering the PMOS transistor region, and p-type impurity ions are implanted into the NMOS transistor region. For example, In ions are implanted along four directions tilted, for example, by 28° from the surface normal under the conditions of an acceleration energy of 50 keV and a dose of $5 \times 10^{13}$ cm$^{-2}$ (hereinafter denoted, for example, 5E13). With this p-type impurity ion implantation, p-type pocket (or halo) regions for NMOS Pkn having a high p-type impurity concentration are formed in the surface region of the p-type well PW. Impurity ions of an n-type are implanted to form n-type first extension regions Exn1. For example, As ions are implanted along a vertical direction under the conditions of an acceleration energy of 5 keV and a dose of 1E15. The outer periphery of the first extension region Exn1 is covered with the pocket region Pkn, realizing a shallow junction depth. The photoresist pattern PR covering the PMOS transistor region is thereafter removed.

Figure 2C:
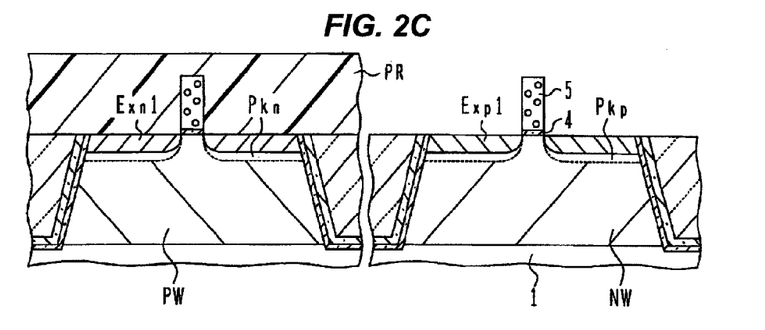

As shown in FIG. 2C, a photoresist pattern PR is formed covering the NMOS transistor region, and n-type impurity ions are implanted obliquely into the PMOS transistor region to form n-type pocket regions for PMOS Pkp, and p-type impurity ions are implanted to form p-type first extension regions Exp1. For example, n-type impurity ions, Sb ions, are obliquely implanted along four directions at an acceleration energy of 60 keV and a dose of 5E13 to form the n-type pocket regions Pkp. Impurity ions of a p-type, B ions, are implanted at an acceleration energy of 5 keV and a dose of 1E15 to form the p-type first extension regions Exp1. The photoresist pattern PR covering the NMOS transistor region is thereafter removed. Since the pocket regions have the same conductivity type as that of the well, the pocket regions are not shown in the following drawings.

Figure 2D:
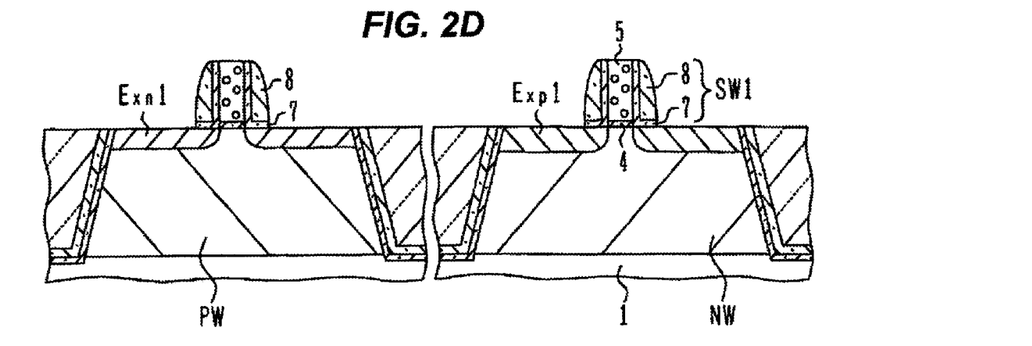

As shown in FIG. 2D, sidewall spacers SW1 are formed on the sidewalls of the gate electrodes, the sidewall spacer being a lamination of a silicon oxide film 7 and a silicon nitride film 8. For example, a silicon oxide film 7 having a thickness of 5 nm to 30 nm is deposited on the substrate, covering the gate electrode structure, by thermal CVD at a temperature of 550° C. to 700° C. using tetraethoxysilane (TEOS) and oxygen as source gasses. A silicon nitride film 8 having a thickness of 10 nm to 60 nm is deposited on the silicon oxide film 7, by thermal CVD at a temperature of 600° C. to 800° C. using dichlorosilane SiH$_2$Cl$_2$ and ammonia NH$_3$ as source gasses. The silicon nitride film 8 and silicon oxide film 7 are anisotropically etched by reactive ion etching (RIE) using hydrofluorocarbon as etching gas, to leave first sidewall spacers SW1 on the sidewalls of the gate electrode structure. The first sidewall spacer SW1 has a thickness of, e.g., 30 nm.

Figure 2E:
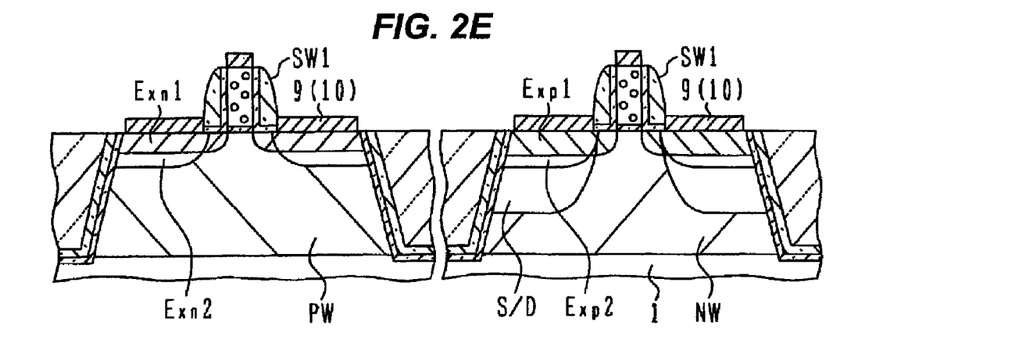

As shown in FIG. 2E, a Si—C mixed crystal (or C-doped Si) film 9, or a Si film 10 is selectively and epitaxially formed on the silicon surface in the active region to a thickness of about 20 nm. Polycrystal is grown on the gate electrode of polysilicon.

The Si—C epitaxial layer 9 is grown by flowing SiH$_2$Cl$_2$ (source gas for Si) at a flow rate of 50 sscm to 300 sccm, SiH$_3$(CH$_3$) (source gas for C) at a flow rate of 2 sccm to 50 sccm, HCl at a flow rate of 30 sccm to 300 sccm, and appropriate flow rate of H$_2$, at a film forming temperature (substrate temperature) of, e.g., 600° C. to 900° C. A pressure in a film forming chamber is, for example, 100 Pa to 5000 Pa. Selective epitaxial growth by low pressure chemical vapor deposition (LPCVD) grows Si—C crystal 9 on the silicon surface and does not grow Si—C crystal on the insulating film. Instead of SiH$_2$Cl$_2$, the source gas for Si may be SiH$_4$, Si$_2$H$_6$, Si$_3$H$_8$, Si$_3$Cl$_6$ or the like. Instead of HCl, Cl$_2$ may be used. SiH$_3$(CH$_3$) is used as the source gas for C. The C composition of Si—C is preferably set to 0.1 to 5.0 at %.

The Si epitaxial layer 10 is grown by flowing SiH$_2$Cl$_2$ (source gas for Si) at a flow rate of 20 sscm to 100 sccm, HCl at a flow rate of 20 sccm to 100 sccm, and H$_2$ at a flow rate of 20 slm to 40 slm, respectively at a film forming temperature of, e.g., 700° C. to 800° C. A pressure in a film forming chamber is, for example, $2.666 \times 10^3$ Pa to $1.333 \times 10^4$ Pa. Selective epitaxial growth by low pressure chemical vapor deposition (LPCVD) grows Si crystal 10 on the silicon surface and does not grow Si crystal on the insulating film.

In the state that the epitaxial layer 9 (10) was grown, the NMOS region is covered with a resist mask, and p-type impurity ions, e.g., B ions, are implanted to form p-type second extension regions Exp2, and p-type impurity ions, e.g., B ions, are implanted deeper at a high concentration to form source/drain regions S/D. The PMOS region is covered with a resist mask, and n-type impurity ions, e.g., P ions, are implanted into the NMOS transistor region to form n-type second extension regions Exn2. The second extension region Ex2 is an impurity doped region between the first extension region Ex1 and source/drain region S/D to lower resistance. The second extension region may be omitted.

Figure 2F:
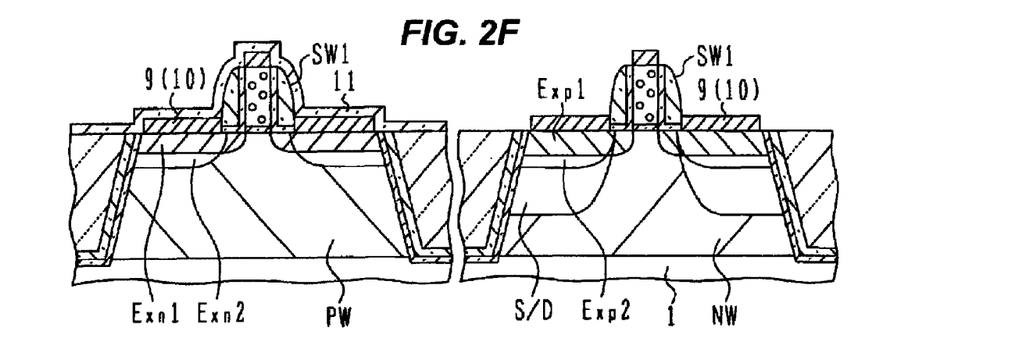

As shown in FIG. 2F, a silicon oxide film 11 is deposited to a thickness of about 40 nm, for example, by high density plasma enhanced chemical vapor deposition (HDP-CVD). A resist pattern is formed covering the NMOS region, and the silicon oxide film 11 in the PMOS region is removed. This silicon oxide film is a hard mask functioning as a mask when the Si—C epitaxial layer 9 or Si epitaxial layer 10 and Si substrate are etched, and may be formed by a process other than HDP.

Figure 2G:
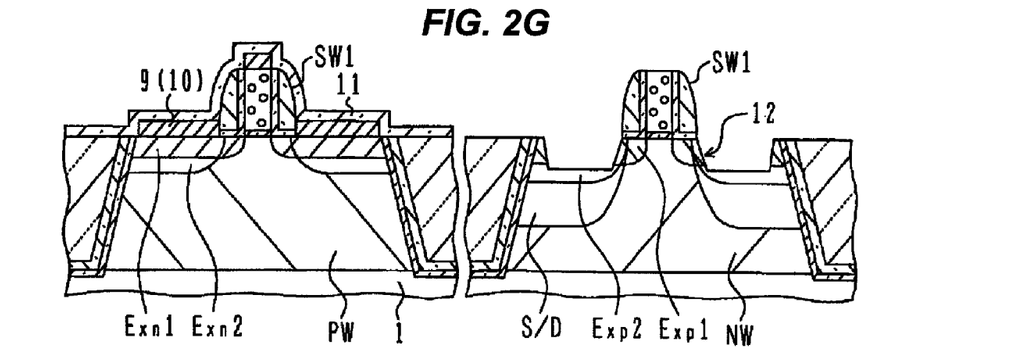

As shown in FIG. 2G, by using the silicon oxide film 11 as an etching mask, the Si—C layer 9 or Si layer 10 grown in the PMOS region and Si of the substrate are etched. Etching is performed to a depth of about 35 nm by RIE using, for example, HBr as etching gas. If the thickness of the epitaxial layer 9 (10) is 20 nm, the Si substrate is etched to a depth of about 15 nm. Next, the Si surface is cleaned by chemical etching using HCl.

Figure 2H:
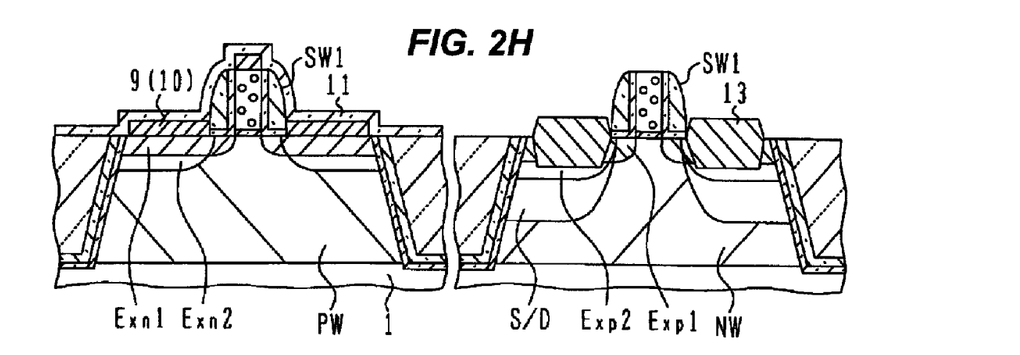

As shown in FIG. 2H, Si—Ge mixed crystal or Si—Ge—C mixed crystal is epitaxially grown on the silicon surface exposed in the PMOS transistor region by low pressure thermal CVD to form epitaxial layers 13. For example, the epitaxial layer is grown by flowing SiH$_2$Cl$_2$ (source gas for Si) at a flow rate of 50 sccm to 300 sccm, GeH$_4$ (source gas for Ge) at a flow rate of 50 sccm to 300 sccm, SiH$_3$(CH$_3$) (source gas for C) at a flow rate of 2 sccm to 50 sccm, HCl gas at a flow rate of 30 sccm to 300 sccm, and H$_2$, at a film forming temperature of, e.g., 500° C. to 800° C. During the growth, p-type impurities B are doped. A pressure in a CVD film forming chamber is, for example, 100 Pa to 5000 Pa.

The Ge composition is preferably set to 5 to 40 at %. If C is doped slightly, thermal stability is improved although the strain amount reduces. It is effective to use Si—Ge—C having a well-balanced composition ratio.

Epitaxial growth occurs only on the Si surface and does not occur on the insulator surface. Growth progresses initially along the recess surface, and the epitaxial layer having a swelled or lifted surface is formed around the sidewall spacers. The surface of the epitaxial layer protrudes above the substrate surface.

Instead of $SiH_2Cl_2$, the Si source gas may be $SiH_4$, $Si_2H_6$, $Si_3H_8$, $Si_3Cl_6$ or the like. $Cl_2$ may be used instead of HCl. This is similar to the epitaxial growth of Si—C mixed crystal. $GeH_2Cl_2$ may be used instead of $GeH_4$.

In the etching process for the source/drain regions, the polysilicon gate electrode of the PMOS transistor is also etched. However, in the Si—Ge growth process, polycrystalline Si—Ge grows also on the polysilicon so that the cavities once formed are buried with Si—Ge.

Figure 2I:
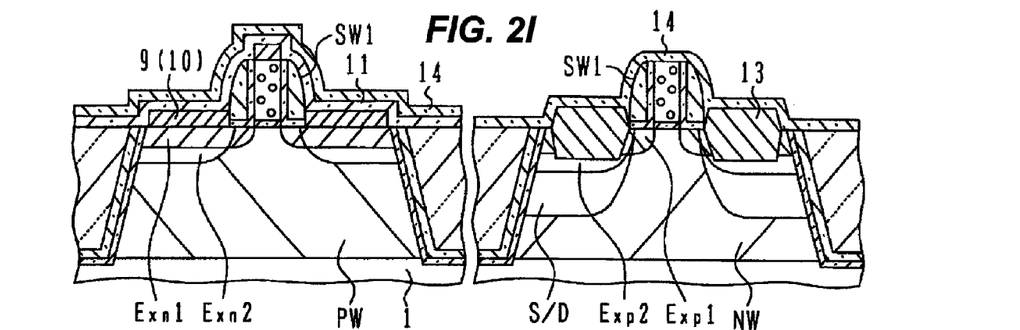

As shown in FIG. 2I, a silicon nitride film 14 is deposited on the substrate. In the NMOS region, the silicon oxide film 11 is covered with the silicon nitride film 14.

Figure 2J:
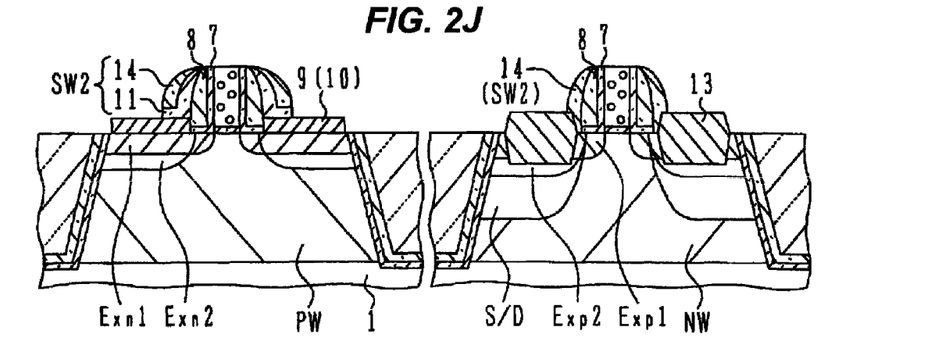

As shown in FIG. 2J, in the NMOS region, the silicon nitride film 14 and the underlying silicon oxide film 11 on the flat surface are removed by RIE anisotropic etching to leave the silicon nitride film and silicon oxide film only on the sidewalls of the gate electrode 5. In the PMOS region, the second sidewall spacers SW2 made of only the silicon nitride film 14 are left.

Figure 2K:
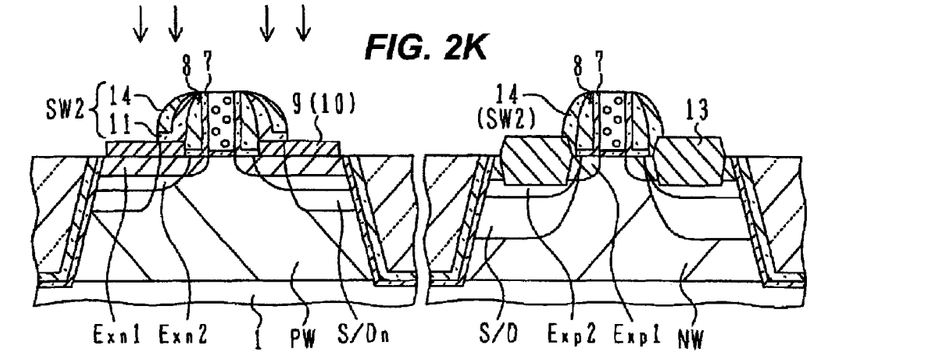

As shown in FIG. 2K, ion implantation is performed for the source/drain regions of the NMOS transistor. The PMOS region is covered with a resist mask, n-type impurity ions, e.g., P ions, are implanted at a high concentration into the Si substrate outside the second sidewall spacers SW2 via the epitaxial layer 9 (10) to form source/drain regions S/Dn.

Figure 2L:
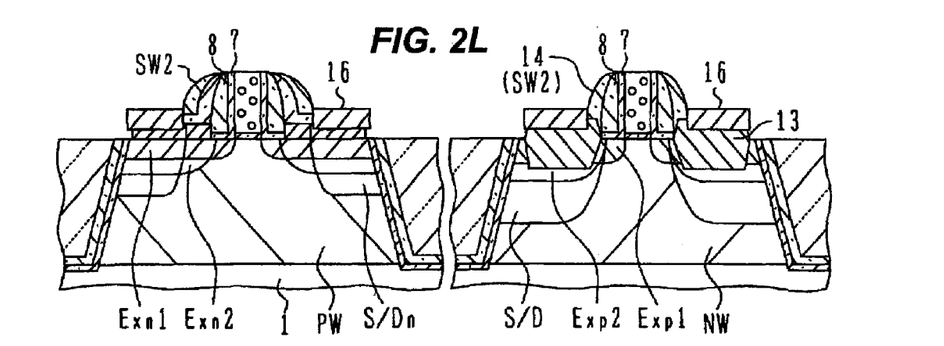

As shown in FIG. 2L, Ni or Ni added with a small amount of Pt is sputtered on the substrate surface, and a silicidation process is performed to form a NiSi silicide film 16. For example, a Ni film preferably having a thickness of 5 nm or thicker is deposited on the substrate by sputtering, and annealing is performed to produce a silicidation reaction. Annealing may be performed further after an unreacted Ni layer is removed. In this way, the NiSi layer 16 is formed on the silicon surface. Instead of Ni silicide, other silicide such as Co silicide may be formed.

The CMOS structure is formed in the manner described above. Since the Si—Ge mixed crystal is buried in the source/drain regions of the PMOS transistors, compressive stress is applied to the channel along the gate length direction. The mobility of the PMOS transistor is therefore improved.

During the ion implantation for the source/drain regions of both NMOS and PMOS transistors, the epitaxial layer 9 (10) exists on the Si substrate to raise the substrate surface. It is therefore possible to mitigate the ion implantation conditions for the source/drain regions.

Figure 3:
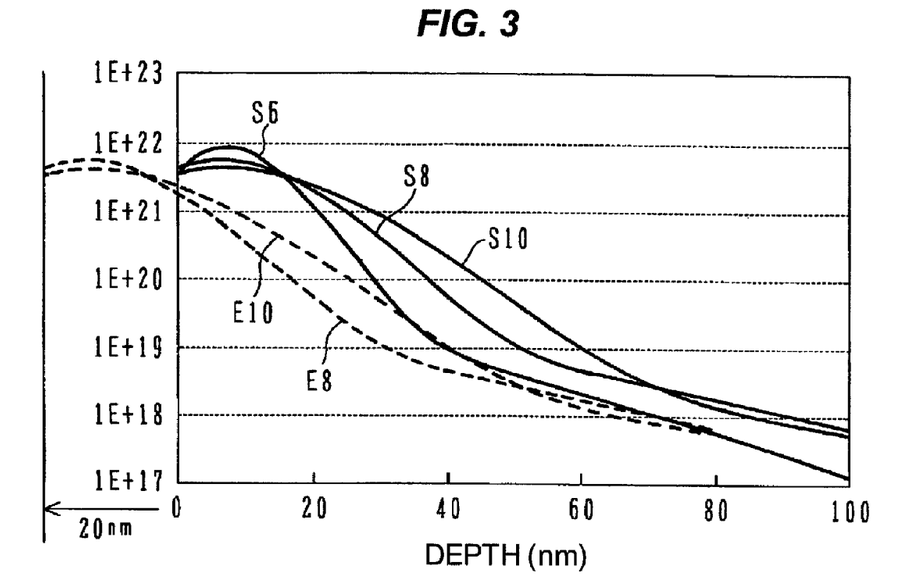
FIG. 3 is a graph of an impurity concentration relative to a substrate depth showing the influence of epitaxial layers in source/drain regions upon an ion implantation process.

FIG. 3 is a graph showing a distribution of implanted impurity ions along a depth direction, using P ions by way of example. The abscissa represents a depth from the surface of a silicon substrate in the unit of nm. The ordinate represents an impurity concentration in the unit of $cm^{-3}$. Curves S6, S8 and S10 show impurity distributions when P ions are implanted into the Si substrate in the state that the epitaxial layer 9 (10) is not formed, at acceleration energies of 6 keV, 8 keV and 10 keV, respectively. In order to form a shallow junction for suppressing the short channel effect, the acceleration energy of 6 keV is used. Curves E8 and E10 show impurity distributions when P ions are implanted into the Si substrate in the state that the epitaxial layer 9 (10) having a thickness of 20 nm is formed, at acceleration energies of 8 keV and 10 keV, respectively. It can be understood that even ion implantation at 10 keV can obtain a junction depth of a level similar to that at 6 keV without the epitaxial layer.

If the epitaxial layer is made of Si—C, tensile stress is applied to the channel of the NMOS transistor along the gate length direction. The mobility of the NMOS transistor is therefore improved.

Figure 4A:
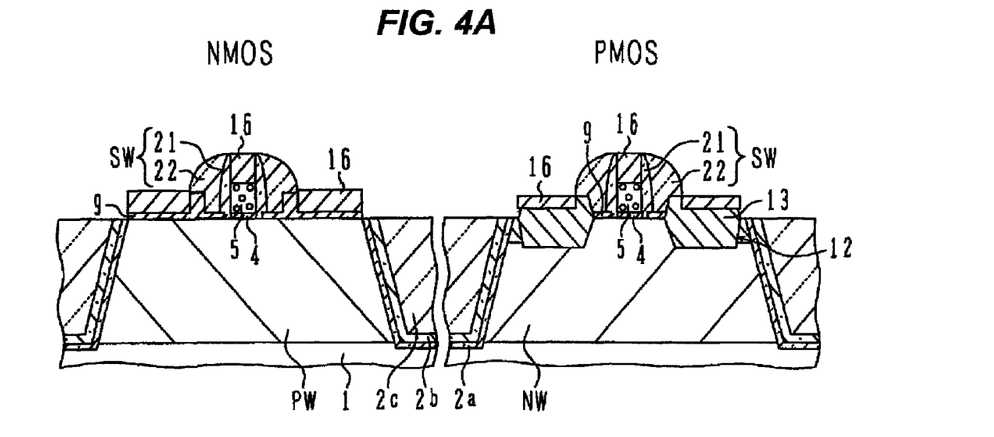
FIGS. 4A and 4B are cross sectional views of semiconductor substrates schematically showing the structures of semiconductor devices according to third and fourth embodiments.
Figure 4B:
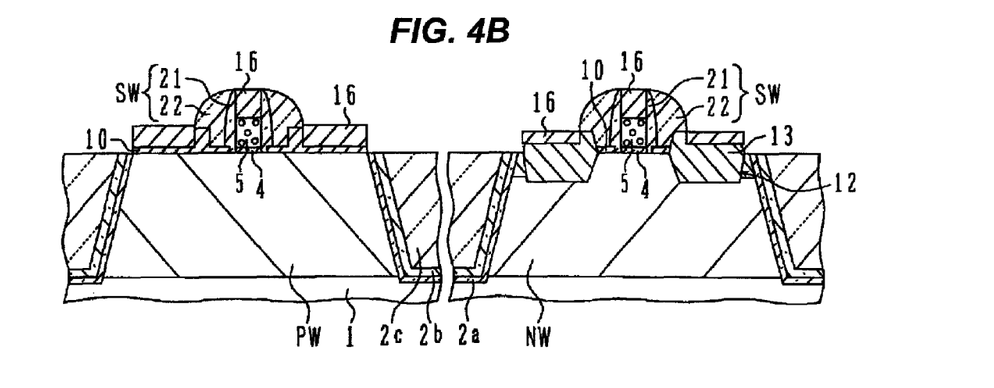

FIGS. 4A and 4B are cross sectional views of semiconductor substrates schematically showing the structures of semiconductor devices according to the third and fourth embodiments of the present invention.

In FIG. 4A, different points from FIG. 1A will be described mainly. A Si—C epitaxial layer 9 is formed at a position spaced by a minute distance from the sidewalls of a gate electrode structure made of a lamination of a gate insulating film 4, a polysilicon layer 5 and a silicide layer 16. An insulating film 21 of a thin silicon oxide film or the like is formed on the sidewalls of the gate electrode structure, burying the gaps between the gate electrode structure and Si—C epitaxial layers.

In an NMOS transistor, another insulating film 22 of silicon oxide or the like is formed on the insulating films 21 to constitute sidewall spacers SW together with the insulating films 21. A silicide layer 16 is formed on the Si—C epitaxial layers 9 outside the sidewall spacers SW.

In a PMOS transistor, recesses 12 are formed in the substrate outside the epitaxial layers 9, and Si—Ge mixed crystal epitaxial layers 13 are formed on the recesses 12. Another insulating film 22 of silicon oxide or the like is formed on the insulating film 21 to constitute sidewall spacers SW together with the insulating films 21. A silicide layer 16 is formed on the Si—Ge epitaxial layers 13 outside the sidewall spacers SW. An impurity concentration distribution in the semiconductor substrate is different from that of the first embodiment. However, this difference is not essential. Other points are similar to those of the embodiment shown in FIG. 1A. In the structure shown in FIG. 4B, a Si epitaxial layer 10 is formed in place of the Si—C epitaxial layer 9. A difference between the third and fourth embodiments is similar to that between the first and second embodiments.

With reference to FIGS. 5A to 5I, description will be made on main processes of a manufacture method for the semiconductor devices of the third and fourth embodiments.

Figure 5A:
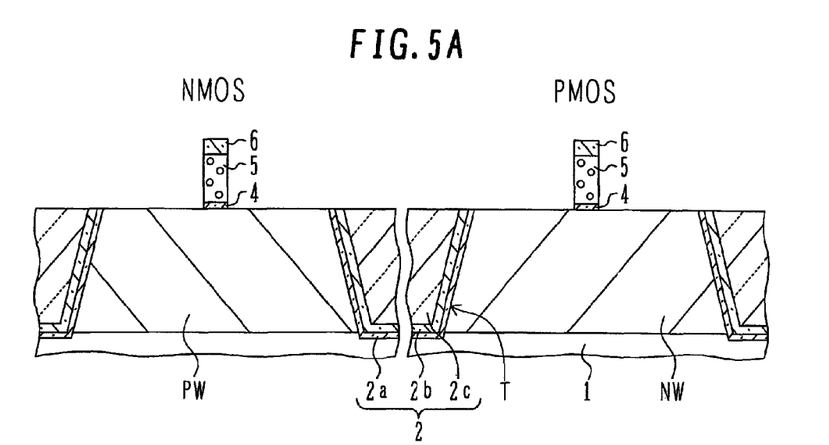
FIGS. 5A to 5I are cross sectional views of a semiconductor substrate illustrating main processes of a manufacture method for the structures shown in FIGS. 4A and 4B.

As shown in FIG. 5A, a gate electrode structure is formed, being made of a lamination of a gate insulating film 4, a polysilicon layer 5 and a cap film 6 of silicon nitride. In the process shown in FIG. 2A, the silicon nitride film 6 is formed on the polysilicon layer 5 by CVD, and thereafter the lamination is patterned into a gate electrode shape. Other points are similar to those of the process shown in FIG. 2A.

Figure 5B:
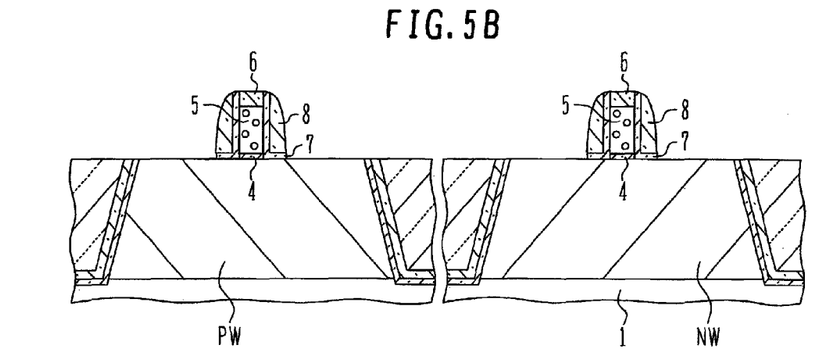

As shown in FIG. 5B, a lamination of a silicon oxide film 7 and a silicon nitride film 8 is deposited and anisotropically etched to leave sidewall spacers only on the sidewalls of the gate electrode structure. In the embodiments, however, these silicon oxide film 7 and silicon nitride film 8 are removed at a later process. The gate electrode structure has the cap film 6 of silicon nitride. The oxide film 7 has a L-shaped cross section with the lateral portion having a side end exposed and a vertical portion having an upper end exposed.

Figure 5C:
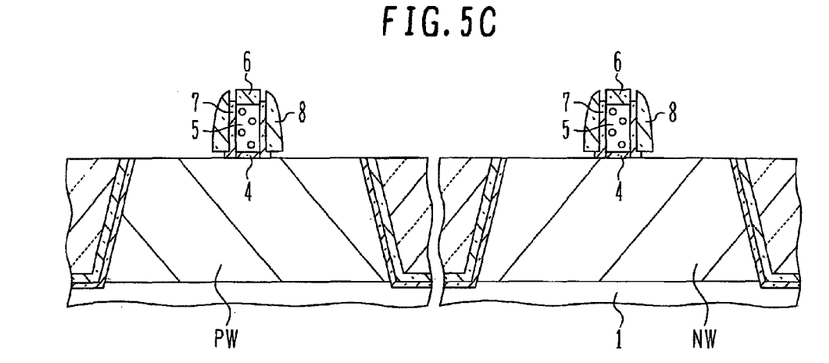

As shown in FIG. 5C, the silicon oxide film 7 is control-etched with dilute hydrofluoric acid. Etching does not reach the gate electrode structure so that the silicon oxide film 7 of a predetermined thickness is left on the sidewalls of the gate electrode structure to form vacancies under the silicon nitride films 8 and inside the silicon nitride film 8.

Figure 5D:
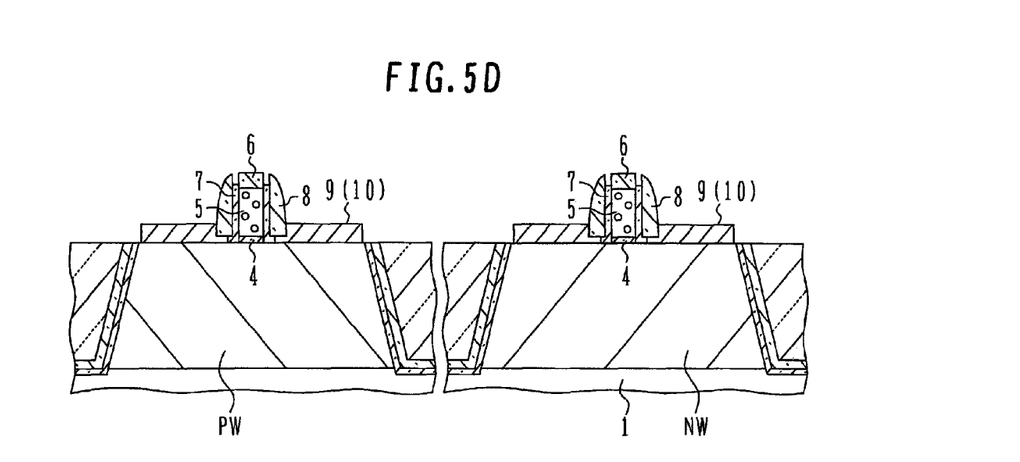

As shown in FIG. 5D, an epitaxial layer 9 (10) of Si—C or Si is grown. This process is similar to the process shown in FIG. 2E, but the epitaxial layer does not grow on insulating films, e.g. on the silicon nitride cap film 6. The epitaxial layer 9 (10) enters the vacancies under the silicon nitride films 8. The grown Si—C epitaxial layer 9 for applying tensile stress extends nearer to the channel so that tensile stress can be applied more efficiently.

Figure 5E:
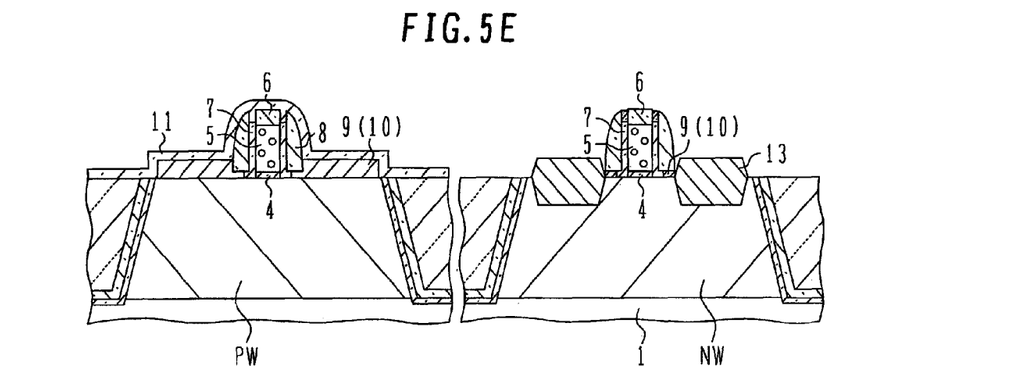

As shown in FIG. 5E, the NMOS region is covered with a silicon oxide film 11 similar to the process shown in FIG. 2F, the epitaxial layer 9 (10) and silicon substrate in the PMOS region are etched to form recesses 12 similar to the process shown in FIG. 2G, and Si—Ge mixed crystal epitaxial layers 13 are grown similar to the process shown in FIG. 2H. The Si—C or Si epitaxial layers 9 (10) are left inside the Si—Ge epitaxial layers 13.

Figure 5F:
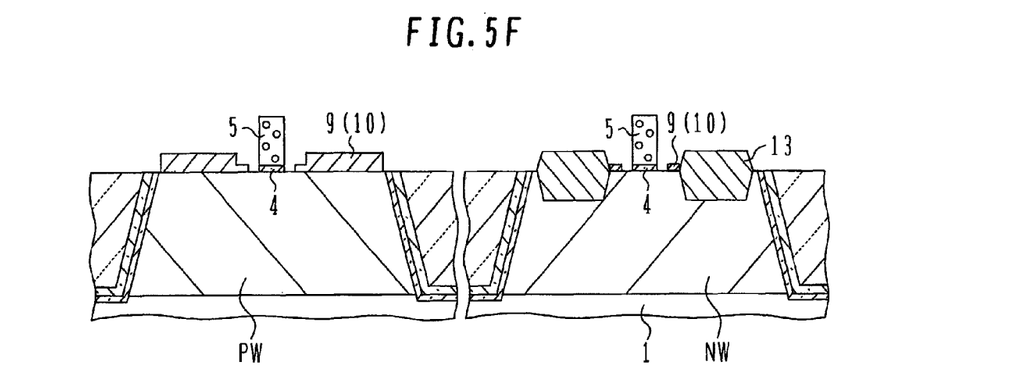

As shown in FIG. 5F, the oxide film on the substrate surface is etched and removed with dilute hydrofluoric acid, the nitride film is etched and removed with hot phosphoric acid, the oxide film 7 is etched and removed with dilute hydrofluoric acid, and the left silicon nitride film is etched and removed with hot phosphoric acid. The silicon nitride film 6, silicon oxide film 7 and silicon nitride film 8 are therefore removed. Gaps are therefore formed between the gate electrode structure and epitaxial layers 9 (10).

Figure 5G:
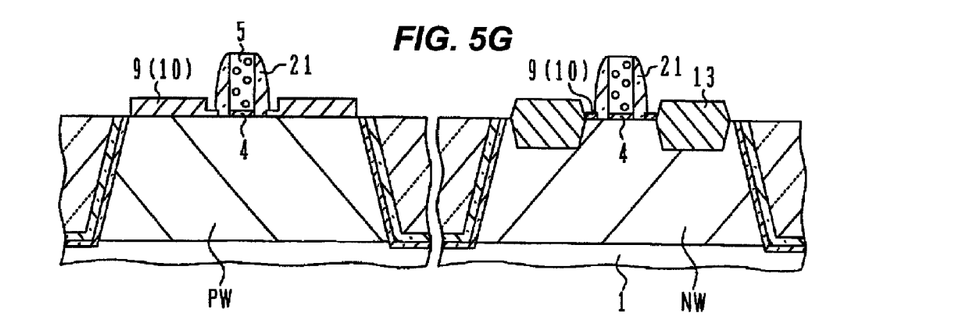

As shown in FIG. 5G, a thin silicon oxide film 21 having a thickness of about 10 nm is deposited on the substrate by CVD, burying the gaps between the gate electrode structure and epitaxial layers 9 (10). Anisotropic etching is performed to leave the silicon oxide films like sidewalls on the sidewalls of the gate electrode structure.

Figure 5H:
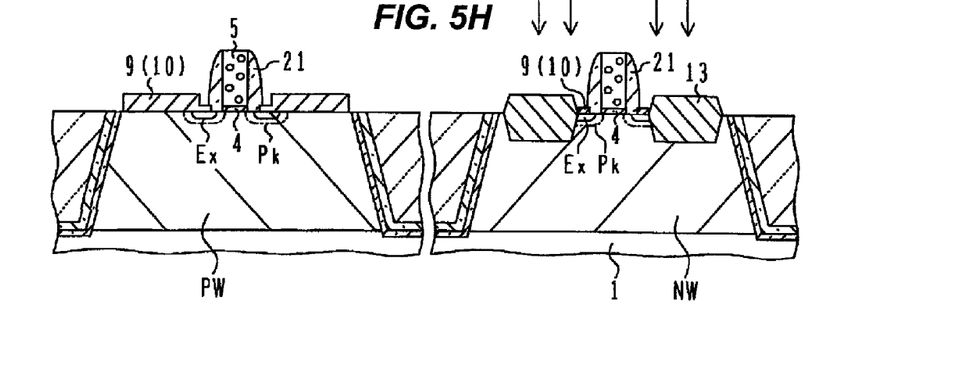

As shown in FIG. 5H, ion implantation is executed to form pocket regions and extension regions. Extension regions Ex and pocket regions Pk are therefore formed under the epitaxial layers 9 (10).

Figure 5I:
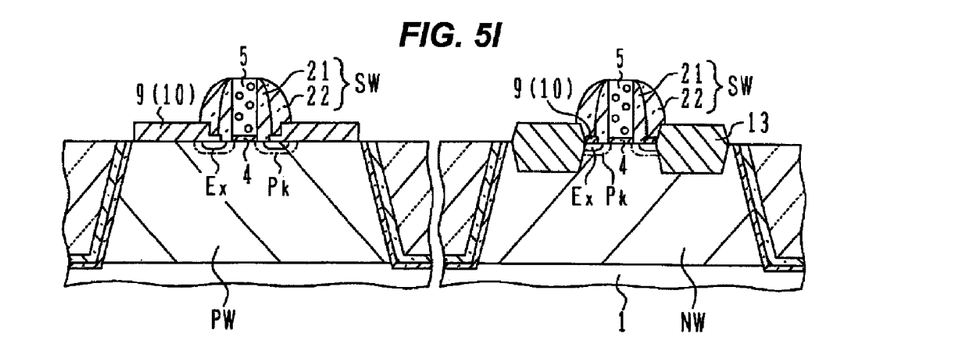

As shown in FIG. 5I, a silicon oxide film 22 is deposited on the substrate by CVD, and anisotropic etching is performed to remove the silicon oxide film 22 on the flat surface. The silicon oxide films 21 and 22 constitute sidewall spacers SW. Instead of the silicon oxide film 22, a silicon nitride film or a lamination of a silicon oxide film and a silicon nitride film may be deposited. Thereafter, ion implantation is executed for source/drain regions. Since the surfaces of the source/drain regions are swelled or lifted by the epitaxial layers 9 (10), the ion implantation conditions can be mitigated.

The present invention has been described in connection with the preferred embodiments. The invention is not limited only to the above embodiments. For example, the conductivity types of the embodiments may be reversed to form an NMOS transistor in place of the PMOS transistor and a PMOS transistor in place of the NMOS transistor, the source/drain regions of the NMOS transistor are etched and dug to form recesses, Si—C crystal is buried in the recesses, and Si—Ge or Si is epitaxially grown on the source/drain regions of the PMOS transistor without forming recesses. The cap film 6 of the third and fourth embodiments may be omitted. Although the silicon oxide film is etched downward, this etched region is buried with polycrystal during epitaxial growth. It will be apparent to those skilled in the art that other various modifications, improvements, combinations, and the like can be made.

What are claimed are:

1. A semiconductor device comprising:
    a semiconductor substrate including a first active region of a first conductivity type, a second active region of a second conductivity type, and an isolation region;
    a first MOS transistor including a first gate electrode structure formed on said first active region, first source/drain regions of the second conductivity type formed in said first active region on both sides of said first gate electrode structure, a first channel region under said first gate electrode structure, recesses dug from surfaces of said first source/drain regions, and semiconductor buried regions of the second conductivity type formed in said recesses and applying stress to the first channel region, said semiconductor buried regions having surfaces at a level higher than a surface of said semiconductor substrate;
    a second MOS transistor including a second gate electrode structure formed on said second active region, second source/drain regions of the first conductivity type formed in said second active region on both sides of said second gate electrode structure, a second channel region under said second gate electrode structure, semiconductor epitaxial layers of the first conductivity type formed on said second source/drain regions without involvement of recesses;
    first source/drain extension regions formed in said first active region on both sides of said first gate electrode structure and between said first source/drain regions and the first channel region;
    second source/drain extension regions formed in said second active region on both sides of said second gate electrode structure and between said second source/drain regions and the second channel region;
    first side wall spacers formed on side walls of said first gate electrode structure and formed above said first source/drain extension regions;
    second side wall spacers formed on side walls of said second gate electrode structure and formed above said second source/drain extension regions;
    third side wall spacers formed on said first side wall spacers and partially covering said semiconductor buried regions;
    fourth side wall spacers formed on said second side wall spacers and partially covering said semiconductor epitaxial layers; and
    silicide regions formed on said semiconductor buried regions not covered with said third side wall spacers and on said semiconductor epitaxial layers not covered with said fourth side wall spacers,
    wherein said semiconductor buried regions are formed between said first source/drain extension regions and the isolation region.

2. The semiconductor device according to claim 1, wherein said semiconductor buried regions are made of Si—Ge or C-doped Si.

3. The semiconductor device according to claim 2, wherein the first conductivity type is n-type, the second conductivity type is p-type, said semiconductor buried regions are made of Si—Ge, and said semiconductor epitaxial layers are made of C-doped Si or Si.

4. The semiconductor device according to claim 2, wherein the first conductivity type is p-type, the second conductivity type is n-type, said semiconductor buried regions are made of C-doped Si, and said semiconductor epitaxial layers are made of Si—Ge or Si.

5. The semiconductor device according to claim 1, wherein:

said semiconductor epitaxial layers each include a first portion having a first thickness and formed in a region near said second gate electrode structure and a second portion having a second thickness thicker than said first thickness and formed in a region remote from said second gate electrode structure; and the semiconductor device further comprises additional semiconductor epitaxial layers formed on said first active region on said first gate electrode structure side of said semiconductor buried regions, said additional semiconductor epitaxial layers each having a same composition as a composition of said semiconductor epitaxial layers formed on said second active region and a same thickness as said first thickness.

6. The semiconductor device according to claim 5, wherein said first portion of said semiconductor epitaxial layers are disposed under said second side wall spacers, and said additional epitaxial layers are disposed under said first side wall spacers.

7. The semiconductor device according to claim 1, wherein the second gate electrode structure includes a gate insulating film formed on the second active region and a gate electrode formed on the gate insulating film, and the silicide layers have bottom surfaces at a level higher than a bottom surface of the gate insulating film.

* * * * *